United States Patent [19]
Langner et al.

[11] Patent Number: 5,708,274
[45] Date of Patent: Jan. 13, 1998

[54] CURVILINEAR VARIABLE AXIS LENS CORRECTION WITH CROSSED COILS

[75] Inventors: Guenther O. Langner, Fultonville, N.Y.; Werner Stickel, Ridgefield, Conn.

[73] Assignee: International Business Machines Corporation, Armonk, N.Y.

[21] Appl. No.: 769,084

[22] Filed: Dec. 18, 1996

[51] Int. Cl.[6] .................................................. H01J 37/14
[52] U.S. Cl. ........................ 250/396 ML; 250/396 R
[58] Field of Search ...................... 250/396 ML, 396 R, 250/398, 492.2; 315/370; 335/210; 313/413, 433

[56] References Cited

U.S. PATENT DOCUMENTS

| | | | |
|---|---|---|---|
| 4,383,176 | 5/1983 | Yonezawa et al. | 250/396 ML |
| 4,414,474 | 11/1983 | Crewe | 250/396 ML |

*Primary Examiner*—Kiet T. Nguyen

[57] ABSTRACT

A charged particle lens has an axis that is shifted to follow the central ray of the beam as it is deflected through the lens creating, in effect, a variable curvilinear optical axis for the lens and introducing aberrations having depending on the object size and the distance off the lens symmetry axis. These aberrations are corrected by a set of coil pairs tilted with respect to the system axis, which generate compensating aberrations of the same type.

11 Claims, 6 Drawing Sheets

CURVILINEAR VARIABLE AXIS LENS CORRECTION WITH CROSSED COILS

BACKGROUND OF THE INVENTION

1. Field of the Invention

The present invention generally relates to particle optical lenses, such as electron beam lenses, and more particularly, to a variable curvilinear optical axis for such lenses including corrections for aberrations introduced by the curvilinear elements.

2. Description of the Prior Art

In light optics, it is possible to maintain low aberrations and distortions while utilizing a significant portion of the lens area for imaging. In electron optics, however, it is not practical to correct the field of a lens to the same extent as with light optics. This is because the electron optical lens is actually a magnetic or electric field rather than a piece of optical glass, and it is not possible to shape the field to any desired form or to the same precision that a piece of glass can be formed. The field must, after all, satisfy LaPlace's equation within the lens. This problem is typically overcome in electron optics by making the lens as large as possible or practical, relative to the optical field of view while keeping the focal length as short as practical for the given application. Making the lens large relative to the application has the effect of approximating the field shape of an "ideal" lens, much the same as is done in light optics when a small portion of a large spherical surface is used to approximate a parabolic surface. In charged particle optics, this means staying as close to the lens center or optical axis, hereafter referred to as the z-axis, to keep the off-axis distortions and aberrations low. It is usually the case that the on-axis lens errors are smaller than the off-axis errors and that the off-axis errors increase with the square or cube of the distance r from the z-axis. If higher order error terms are considered, than the errors will increase as the higher powers of the terms.

It is possible to deflect an electron beam at very high speeds either electrically or magnetically or a combination of both. Thus, any point can be addressed within a relatively large deflection field in very short times (on the order of microseconds or even nanoseconds). The final location of the beam can also be corrected during deflection by modifying the deflection address according to some predetermined distortion map acquired during system calibration and/or wafer registration. This is a common practice, but it only corrects the landing position of a single ray or small bundle of rays defining a point which is transferred from the object plane to the image plane. Any lens errors will still distort the local region about this central ray. A common practice to correct some of this local image distortion is to refocus and apply a stigmation correction to the off axis beam. The further the beam is deflected off the central z-axis, the greater the deflection aberrations will become. At some point, further deflection is rendered unusable due to excessive lens aberrations that are not correctable by methods known in the art. The inventions disclosed in U.S. Pat. No. 4,859,856 for a Variable Axis Lens (VAL) and U.S. Pat. No. 4,544,846 for Variable Axis Immersion Lens (VAIL) used a technique of subtracting a planar field from the radial field component of the lens. This planar field is everywhere parallel to the radius vector r connecting the central z-axis and the point to which the beam is deflected. The term "planar" is used to refer to a field, such as that resulting for example from a deflection yoke (short for a set of coils wound typically either in a saddle or toroidal configuration on a bobbin or yoke), where the field in any x-y plane is uniform, but the magnitude of the field may vary according to a smooth function of z as one moves along the z-axis. As described in the above inventions, the strength of the planar field subtracted from the radial lens field is proportional to the first derivative of this component with respect to the axial position, z, and to the distance r the lens field is to be shifted in the radial direction. The typical method of applying the planar field is by means of a deflection yoke sized and positioned to match the negative of the first term in the power expansion of the radial field component of the lens. This has the effect of shifting the optical axis laterally with the pre-deflected beam so that to the beam it appears as though it is still on the optical axis. By this method, the off-axis errors of the lens and deflection system can be greatly reduced.

This technique is not a perfect solution because it corrects the off-axis errors only to the first order in the field expansion, although this is the greatest part of the errors. However, this approach also assumes that the shifted axis of the lens remains essentially straight and parallel to the central z-axis, which is also the geometric axis of the lens. The electron beam is deflected prior to entering the field of the lens such that the beam stays on or near the shifted axis as it travels through the lens. This is done so that the electron beam does not deviate substantially from the shifted axis and therefore does not incur any errors greater than is allowed by the system error budget. Such an approach requires a considerable spacing between lenses and deflection yokes; however, in a practical system design, significant overlap of the beam deflection and lens fields will occur, since other performance-impairing factors provide a strong incentive to keep the beam path short. Such overlap effectively creates a beam path that is now curved rather than straight within the lens field.

An improvement over the previous example of a particle variable straight axis lens shifts the axis of the lens not by a constant amount, but as a function of the position off the z-axis along the beam path so as to follow the central ray of the beam as it is deflected by both the yoke or yokes and the lens, creating, in effect, a variable curvilinear optical axis for the lens that follows the predetermined path of the deflected electron beam. This is accomplished by applying a planar field to the lens to cancel the first term of the power expansion of the radial field component expression with a function that is dependent on the position along the z-axis. This function is given by the trajectory of the central ray of the electron beam, which originates from an off-axis point on the reticle. The curvature in the beam path results in a variable angle between the direction of the central ray of the beam and the symmetry axis of the lens field that introduces a new group of aberrations. So far essentially only a beam has been considered defined by the central ray of a bundle of rays (a 'beamlet') distributed within a cone around the central ray determined by the conditions, by which a point in the object is illuminated by the particle source. In practice, however, the beam is comprised of a multitude of such beamlets, each representing a point within a section of the object, hereafter referred to as a subfield, of finite and, with respect to the details of the object to be imaged, potentially large size. The subfield as a whole is deflected, including all the beamlets within it simultaneously, and the total beam is conveniently represented by the central ray of the beamlet coming from the center of the subfield.

The problem to be solved, therefore, is how to compensate the additional aberrations caused by imaging an object along a variably shifted curvilinear axis rather than a variable straight axis.

SUMMARY OF THE INVENTION

The invention relates to a variable curvilinear axis lens and system having correction elements for applying magnetic or electric fields that bend the shifted axis of the lens or lenses in such a way as to coincide with the direction of the beam and also provide an essentially symmetric field environment azimuthally around the curvilinear axis.

A feature of the invention is the addition of correction elements that operate in a plane perpendicular to the z-axis and are tilted with respect to the x-y plane.

BRIEF DESCRIPTION OF THE DRAWINGS

The foregoing and other objects, aspects and advantages will be better understood from the following detailed description of a preferred embodiment of the invention with reference to the drawings, in which:

FIG. 6b illustrates the combined field from the coil pair of FIG. 6a.

DETAILED DESCRIPTION OF A PREFERRED EMBODIMENT OF THE INVENTION

An electron optical lens, typically used in probe forming and projection imaging systems, is a magnetic axially symmetric lens. The description of the preferred embodiment of the invention will be in the context of this type of lens and imaging system, although the concept may be applied to other and different embodiments of the invention.

Figure 4:
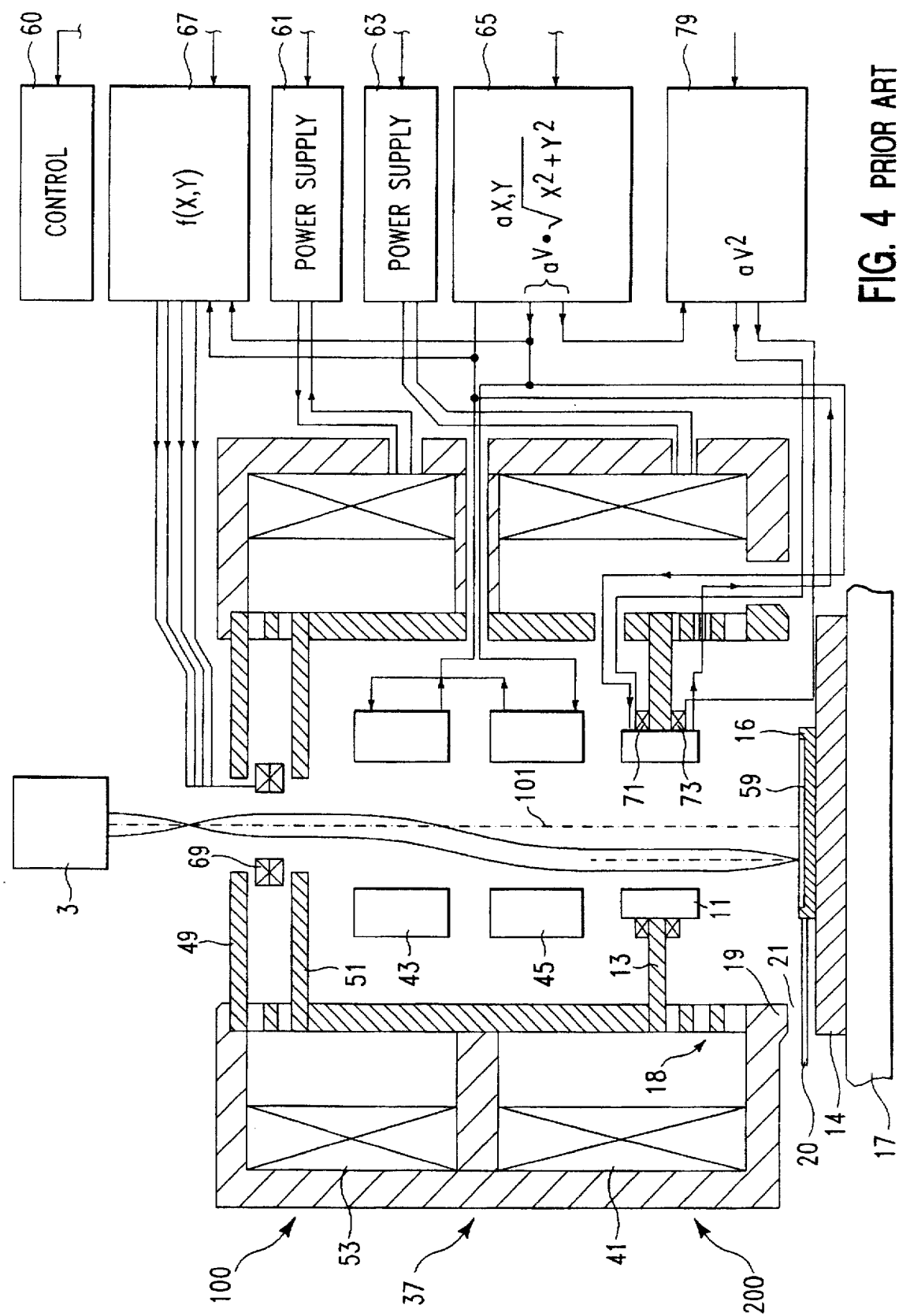
FIG. 4 illustrates in partially pictorial, partially schematic form a variable axis lens electron beam system according to the prior art.

Referring now to the drawings, and more particularly to FIG. 4, there is shown a portion of a variable axis lens electron beam projection system of the type disclosed in U.S. Pat. No. 4,544,846. A Variable Axis Immersion Lens (VAIL) is used as an example for illustration. However, the general Variable Axis Lens (VAL) can equally be used as an example (U.S. Pat. No. 4,376,249). The VAIL was chosen for simplicity because the VAIL is one half of a VAL. At the top of the Figure, a box 3 denotes schematically an initial portion of the system that generates an electron beam travelling downward in the Figure, initially centered on the system or physical axis 101 of the hardware, which is also the z axis of the coordinate system. Box 3 may be an electron gun, in the case of a probe forming system; or it may be the upper portion of a projection imaging system that passes the beam through a reticle in order to transfer the reticle "pattern" by means of the electron beam to a target wafer. The portion of the optical system shown in FIG. 4 collimates the beam emerging from box 3 and brings the beam to a focus on wafer or target 59 at x and y positions that are controlled by controller means illustrated schematically on the right of the figure. A general purpose computer or dedicated controller 60 sends signals to power supplies 61 and 63 and signal generators 65, 67 and 79, all collectively referred to as control means. The optical system includes a magnetic lens 100, extending a lens length along axis 101 and having pole pieces 49 and 51. Lens 100 includes an excitation coil 53 for applying a magnetic focusing field through pole pieces 49 and 51, collectively referred to as field generating means, providing telecentric capability, as is known in the art. Dynamic focus correction coil 69 is conventionally used as required by system tolerances to provide higher-order corrections (proportional to $r^2$, etc.) to lens 100.

A pair of magnetic deflection yokes 43 and 45 predeflect the projected electron beam, under control of the controller means, before it enters variable axis lens 200 in the lower portion of the figure to direct it at the desired x and y coordinates on wafer 59. In one example, such a system can be used to fabricate a reticle by scanning across the surface of the reticle and exposing the reticle pattern. Such a system can also be used for direct writing on a wafer without the use of a reticle.

Variable axis immersion lens 200, in the lower portion of FIG. 4, includes an upper pole piece 13 and a lower pole piece 14. Excitation coil 41 activates immersion lens 200 and produces magnetic field lines that run from upper pole piece 13, having a non-zero bore that permits passage of the beam, to lower pole piece 14. A leg 18 of the immersion lens magnetic circuit includes alternating magnetic and non-magnetic sections so as to shield metal parts of lens 200 from changing yoke fields while at the same time preventing the magnetic lines of force of the lens from being short-circuited. The magnetic circuit is also shaped at section 19 of the lower pole piece to permit flux to pass to zero bore section 14 with minimal reluctance and fringing. A single magnetic compensation yoke 11 provides a magnetic field that is proportional to the first derivative of the axial magnetic field produced by immersion lens 200. Yoke 11 and its associated signal or current generator may be referred to as axis shifting means. A non-immersion lens similar to lens 100 could be used instead of immersion lens 200, though the overall length of the system would be greater.

FIG. 4 also illustrates the target holding, handling, and stepping stage. Target 59 is mounted to a target holder 16 for providing accurate registration of the target within the electron beam projection system. A target handler arm 20 inserts the target into lens 200. A target stepper table 17 is employed for x-y movement of the target. Since the magnetic projection field produced by upper pole piece 13, lower pole piece section 14 and excitation coil 41 has zero slope in the vicinity of the target area, the compensation field produced by compensation yoke 11 has zero field strength in the vicinity of the target area. Accordingly, no eddy currents are generated by compensation yoke 11 in or around the target area.

Astigmatism and field curvature are corrected using dynamic correction. As shown in FIG. 4, a power supply 61 is connected to excitation coil 53, and a power supply 63 is connected to excitation coil 41. A computer controlled driver 65 supplies excitation signals to deflection yokes 43 and 45. Deflection yokes 43 and 45 have two sets of magnetic coils that cooperate to generate a magnetic field in the x-y plane, perpendicular to axis 101, to deflect the electron beam in both an x and a y direction. Deflection yokes 43 and 45 are typically comprised of a plurality of yokes of saddle or toroidal configuration. Driver 65 also activates magnetic compensation yoke 11 which consists of a pair of x-y magnetic deflection yokes. Magnetic compensation yoke 11 may comprise a simple saddle coil because of its smaller outside diameter as compared to a toroidal yoke of the same deflection sensitivity. The x-y current sent to magnetic compensation yoke 11 is proportional to the x-y currents sent to deflection yokes 43 and 45 and may be supplied by the same driver 65. A driver 79 connected to dynamic focus correction coils 71 and 73 receives an input signal which is proportional to r, the deflection distance of the shifted axis, and generates a signal proportional to $r^2$.

In the first approximation, the field of the axis-shifting yoke 11 compensates the radial component of the lens 200 field along a line parallel to the symmetry axis of the lens and having an x-y position proportional to the current into the compensation yoke. This line represents the shifted electron optical axis because the radial component of the field has become zero there.

In operation, yokes 43 and 45 will be driven to steer the beam to selected points on wafer 59. Compensating coil 11 will be driven to center the optical axis of lens 200 above the desired position on the wafer.

VARIABLE AXIS LENS

The magnetic field of an axially symmetric lens can be uniquely described anywhere inside the lens by the distribution of the magnetic flux density on the axis of the lens. The normal lens axis 101 defined by the mechanical center of the lens will also be referred to as the system axis and the shifted or variable axis will be referred to as the "variable axis". The radial component (designated $B_r$) of the field anywhere in the lens is described by the infinite series $$B_r(r,z) = \sum_{n=1}^{\infty} \left(\frac{r}{2}\right)^{(2n-1)} \frac{(-1)^n \frac{d^{(2n-1)}}{dz^{(2n-1)}} B(z)}{n!(n-1)!} \quad (1)$$

where z is the position along the system axis. On the axis, r=0 and therefore, $B_r$=0. If $B_r(r,z)$ is set equal to zero at some non-zero r by setting all the terms of Equation (1) equal to zero, then the axis of the lens is shifted to this new location of r. The series of the Equation (1) converges very rapidly, and the first term is the dominant term of the series. The first term of this series is $$B_r(r,z) = -\left(\frac{r}{2}\right)\frac{d}{dz} B(z) \quad (2)$$

Thus, if this first term is set equal to zero at a specific value of r by adding a planar field in the direction of r that is of equal magnitude to Equation (2) for the given value of r but of opposite sign, then in effect the axis of the lens is shifted magnetically to this new location of r. In the prior art variable axis electron optical lens system as shown in FIG. 4, the value of r is constant, thus shifting the axis laterally as a straight line parallel to the original axis. This planar field is easily approximated very well by a typical deflection yoke field.

When the electron beam has been deflected prior to entering the imaging lens 200, so that the beam is travelling parallel to the system axis, then the electrons entering on the shifted axis will continue on this axis traveling in a straight line. This deflection prior to the lens is not easy to achieve in practice because the deflection magnetic field and the lens magnetic field do not end abruptly but, rather, taper to a small value over relatively large distances and it is not practical to space the deflection coils far enough away that the fields do not overlap. The more the overlap, the more the electron beam will be off the variable axis through a longer portion of the lens. As the overlap increases, the lens and deflection errors also increase. Thus, as a given system is made more compact, the error reduction benefits of using a variable axis lens become vanishingly small.

The problem caused by the overlap has been addressed by making the shifted axis curvilinear, rather than straight. This is achieved by applying the planar correction field to the lens field in order to cancel the first term of the radial component of the lens field using a non-constant function of the z-position, R(z), in Equation (2) instead of the constant term, r. This function is the r-coordinate of the trajectory of the central ray of the electron beam.

The physical implementation of the z-dependence is effected by the use of a plurality of compensation yokes of the same type as coil 11 in FIG. 4 to provide a contigually smooth displacement of the variable axis so as to follow the beam trajectory. The greater the number of compensation yokes, the better the approximation to produce the magnetic field which establishes the desired curvilinear axis.

Figure 1:
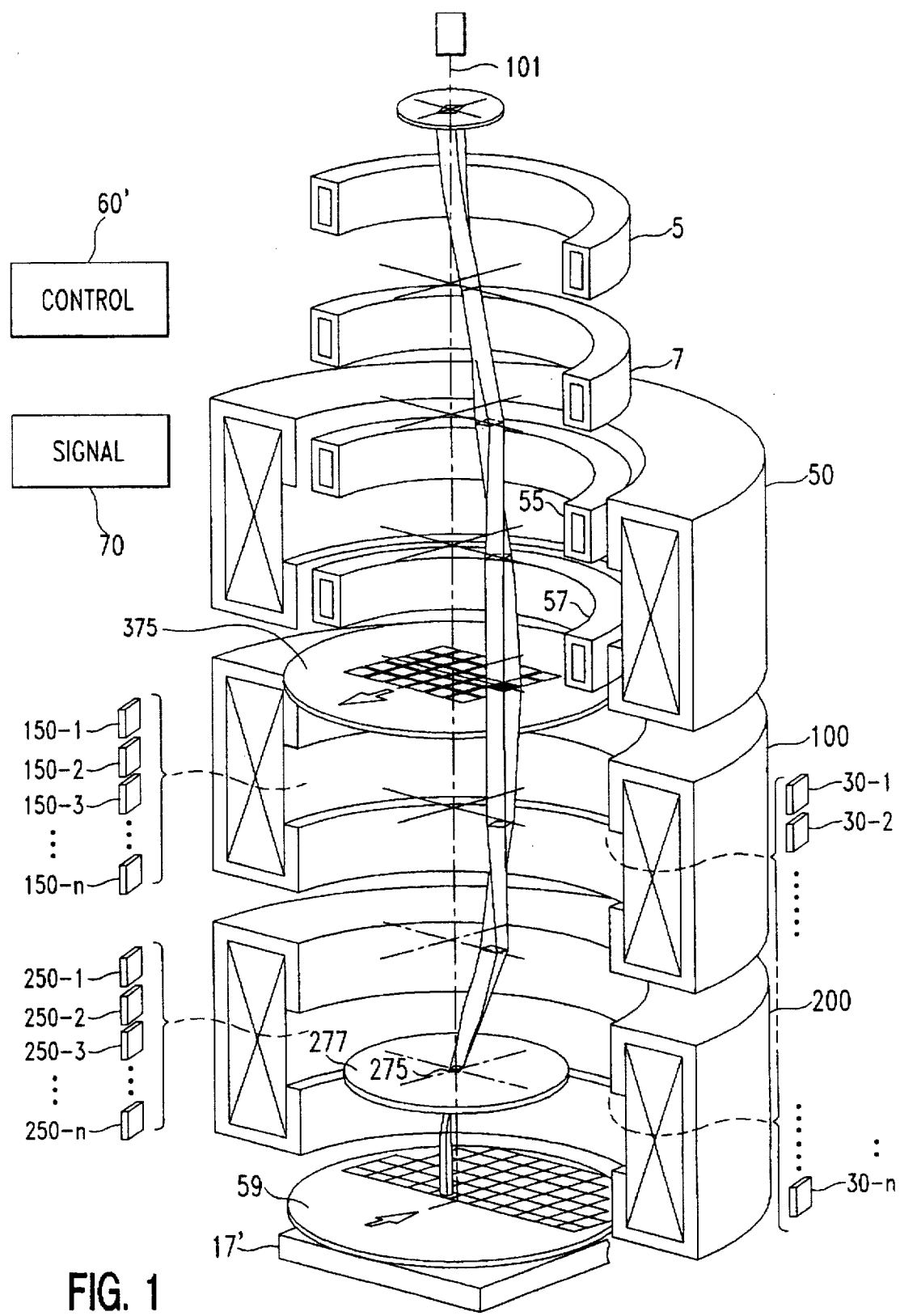
FIG. 1 is a partially pictorial, partially schematic drawing illustrating a variable axis lens electron beam system on which the invention is implemented.

Referring now to FIG. 1, there is shown in partially pictorial, partially schematic form a projection electron beam system employing the present invention, the bottom portion of which corresponds to FIG. 4. The invention applies to any deflection lens system, such as a probe-forming system, a shaped-beam system, or a scanning electron microscope. The projection system is chosen merely as an example and also because it requires the most demanding image fidelity over a large field of view, not just a probe or a small shaped spot. At the top of the figure, box 1 represents schematically the electron gun that generates a slightly diverging beam, having an energy of illustratively 100 keV and travelling along the z-axis 101. Controller 60' and signal generator 70, analogous to boxes 61, 63, 65, 67 and 79 of FIG. 4, perform similar functions of controlling lens coils and deflectors. Deflectors 5 and 7 are used together as is known in the art to deflect the beam so that the extrapolated intersection point of the beam trajectory with the z-axis 101 is located between the two yokes 5 and 7. This point is the conjugate image point of aperture 275 discussed below. The current in yokes 5 and 7 are nearly equal and are adjusted during system setup so that no lateral motion of the beam is observed at aperture 275, thereby decreasing the variation of beam current impinging the target wafer 59. Variations of beam current of less than 1% can produce intolerable critical dimension errors within the circuit pattern transferred from the reticle to the wafer. The combination of deflectors 5, 7, 55 and 57 is set as is known in the art to illuminate the nth subfield of reticle 375 with a shaped beam that impinges the reticle plane with nearly perpendicular landing.

Reticle 375 represents the pattern on a layer of an integrated circuit and is divided into subfields, illustratively on the order of 1 mm on a side and carrying the pattern that is to be imaged on wafer 59 at the bottom of the figure. The beam will step in sequence through the subfields on the reticle, the totality of which represents the pattern of the integrated circuit. Such a system is described in U.S. Pat. No. 5,466,904. Illumination lens 50, which may be a curvilinear axis lens according to the invention or a conventional variable axis lens, forms an image of the emitting surface of the electron source or cathode on the nth subfield by means of deflectors 5, 7, 55 and 57. This has the effect of illuminating the reticle pattern. The beam passes through the reticle to curvilinear variable axis collimator lens 100, positioned along axis 101 at a distance from the reticle nearly equal to its focal length and which produces an image of the reticle at or near infinity so that there will be the minimum amount of Coulomb interaction between the electrons in the beam and also to minimize the chromatic effects due to deflection.

The beam is then deflected back toward axis 101, crossing the axis at aperture 275, by the action of a set of combination deflection-axis compensation yokes 150-1 to 150-n located inside lens 100 and distributed along the beam path in the axial direction (parallel to axis 101) that both shift the variable axis so as to be coincident with the central beam trajectory along its entire length, thereby establishing a curvilinear field axis, and also perform deflection of the beam as required. Illustratively, yokes 150 are placed radially inside the magnetic pole pieces of lens 100. They are shown displaced in the drawing for ease of illustration. On the right side of the figure, boxes 30-1 to 30-n represent schematically elements for correction of the new errors. Each of the yokes 150-1 to 150-n is excited with a control current that is proportional to the magnitude of deflection and of a fixed relative ratio to each of the other compensation yokes for axis shifting and also with a current to provide any required deflection. This fixed relative ratio is determined from the lens, yoke, and central beam trajectory physical relationships such that the best fit of the desired compensation field is applied, as described below. The use of a fixed ratio is an approximation for convenience and system simplicity. In the most general case, a fit could be made for each subfield of the reticle, with the results stored in the controller means. The current ratios in the coils would then be determined by this stored value. By "fixed" is meant that the ratio does not vary as a function of x and y when using a first order approximation.

After passing through the reticle 375, some of the electrons comprising the illuminating beam will be slightly scattered because they passed through the patterned portion of the reticle. These scattered electrons are absorbed in plate 277 which contains aperture 275 while aperture 275 passes the unscattered electrons in the beam down to the wafer 59 to form the image of the reticle pattern. Reticle 375 may be either a "stencil" reticle, having openings for radiation to pass through, or it may be a "differential" reticle, having areas of relatively low and high scattering cross section, as described in U.S. Pat. No. 5,466,904.

Lens 200 forms a reduced image of the nth subfield of reticle 375 on wafer 59. In this embodiment of the invention, lens 200 is a curvilinear variable axis lens (CVAL) that is not an immersion lens. A curvilinear variable axis immersion lens (CVAIL) having a plurality of axis-shifting coils and a plate similar to plate 14 of FIG. 4 could be used if the system designer preferred. Those skilled in the art will readily appreciate that the use of an immersion lens results in a strong field at the wafer surface, while making it difficult to satisfy the doublet condition between lenses 100 and 200 referred to below; and that the use of a non-immersion lens results in a smaller fringe field at the wafer surface and permits easier satisfaction of the doublet condition. System designers will select one or another system configuration depending on the usual design tradeoff considerations. At the bottom of the figure, box 17' represents schematically the associated wafer support, positioning mechanism, and the like shown in FIG. 4. Illustratively, the reduction ratio has a conventional magnitude in the range between 3:1 to 5:1. This demagnification ratio is achieved by the combination of lenses 200 and 100 which form a doublet pair as described in U.S. Pat. No. 5,466,904.

Within lens 200, deflectors $250_i$ guide the beam through aperture 275 and on to the nth subfield position on wafer 59, also performing "stitching" when required to correct for a finite separation of the subfields on reticle 375 by shifting the images so that they are contiguous. As with deflectors $150_i$, they also provide the axis-shifting function. The invention may be used with reticles that have both contiguous or non-contiguous subfields.

Figure 3:
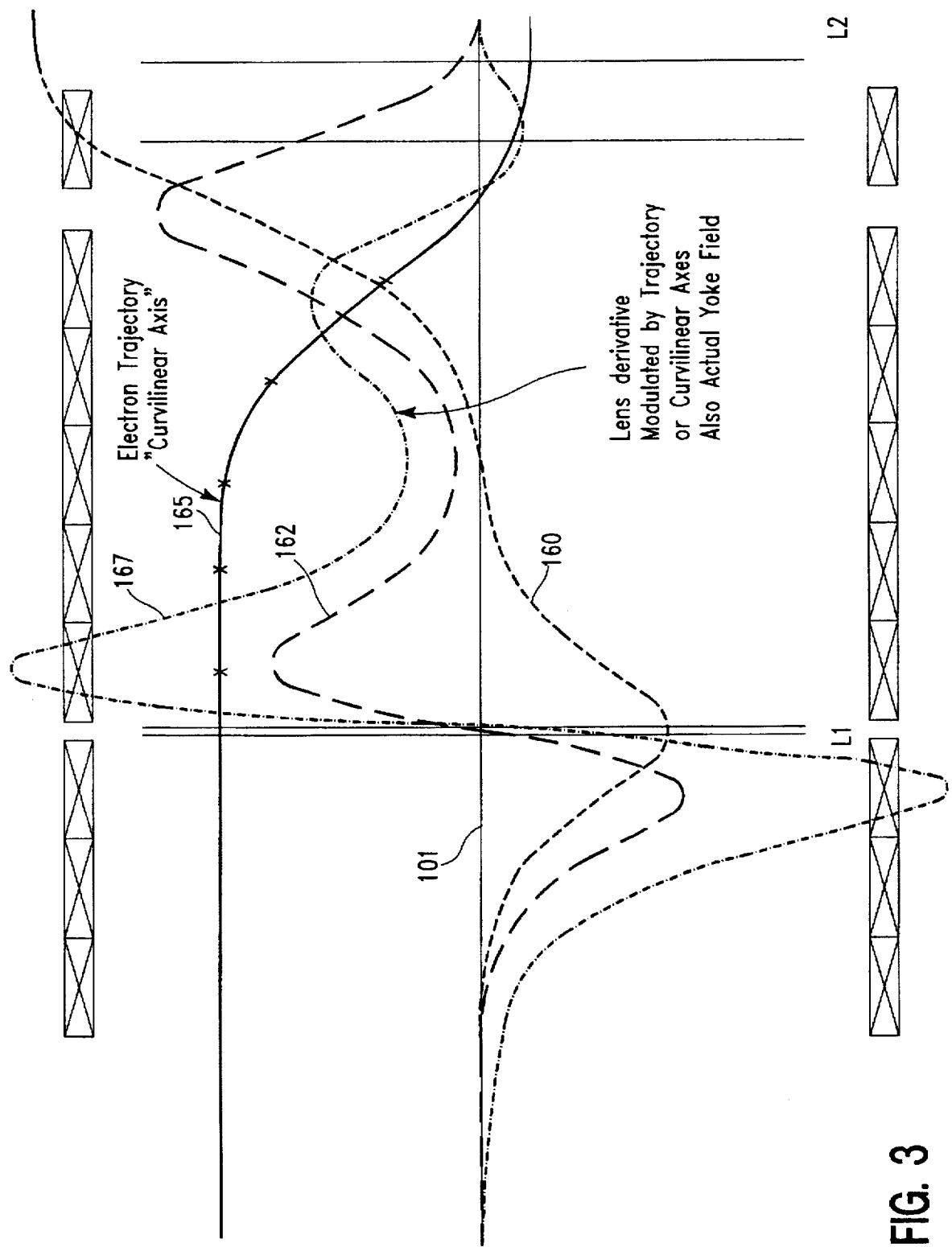
FIG. 3 is a schematic cross-sectional view of an electron optical lens showing the axial flux density of the lens; and the lens field derivative modulated by a trajectory or curvilinear axis and a typical trajectory that may be of interest in an optical system.

Referring now to FIG. 3, there is displayed a set of curves illustrating the relation between the lens field, the axis-shifting field and the beam trajectory. Line 160 represents the axial flux density of a typical doublet lens system. For generality, the lens system illustrated is not necessarily the one used in FIG. 1. The boxes at the sides of the figure represent correction coils that shift the axis. No particular number of correction coils is required and the correction coils are not necessarily limited in the z-direction by the lens pole pieces. They may extend a coil length along the system axis 101 that may be greater than, equal to, or less than a lens length between the pole pieces. A first lens L1, not shown in the Figure, is centered at the mark L1 and a second lens L2, also not shown in the Figure, is centered at a corresponding mark on the right of the drawing, showing the effect of its fringing fields. The magnitude of the flux peaks midway between the positions of the pole pieces and tapers off above and below. The dashed line 162 is the first derivative of the axial flux with respect to z. To use this lens as a variable curvilinear axis lens system according to the invention, a planar field that is uniform within any plane perpendicular to the z-axis and that varies in magnitude along the z-axis, proportional to the dashed curve, is applied to the lens field.

FIG. 3 also shows an added solid line 165 that is an example of the radial position of a typical trajectory that may be of interest in an optical system. There could be any number of trajectories used as an example. This trajectory represents the central ray of a deflected electron beam used in a projection lithography system. The x's on the trajectory are located at the central point of the corresponding coils. For convenience in terminology, the plane at the center of a coil $150_i$ or $250_i$ will be referred to as an axis-shifting plane that is located at an axis-shifting positions along the system axis. As can be seen by its relationship to the lens field (line 160), a straight shifted axis parallel to the z-axis would at best be at the same distance from the axis at only a very small portion of its length or even at only one point. However, by modulating the first derivative of the lens (the dashed line) by the trajectory or R(z), the distance from the z-axis, a new function Y(z) of curve 167 is obtained (the dash-dot-dashed line 167). This function Y(z) replaces the first term of Equation (2) as follows:

$$Y(r,z) = -\left(\frac{R(z)}{2}\right)\frac{d}{dz}B(z) \tag{3}$$

This is a function of z and determines the magnitude of the field to be superimposed on the lens field as a function of z. As before, this field is achieved with typical deflection yokes (either of the saddle type or toroidal wound type). The terms deflection yoke or coil and compensation yoke or coil are used interchangeably here because the coils implemented to apply a field in any x-y plane can be used for deflection and/or axis shifting by means of superposition of the fields using the appropriate control signals applied to each axis of a single coil.

The function Y(z) is the curvilinear axis yoke field to be applied to the lens in order to curve the axis of the lens to follow the beam path through the lens, thus forming a curvilinear axis lens. Any of the higher order terms could also be applied if accuracy requirements dictated, forming additive functions in z containing higher powers of R(z), $R(z^3)$, $R(z^5)$, etc. Typically, however, only the first order term is applied for simplicity and because it is by far the dominant term. Generally, each successive term is two orders of magnitude smaller than the preceding term for magnetic lenses of the type used in the illustrative projection system. Line 167 in FIG. 3 shows an actual yoke field that can be practically achieved for this example. The particular associated line 165 was selected as an example to show that when the trajectory passes through the system axis, curve 167 is forced to zero, even though the derivative 162 (used in the prior art) is quite large at this point.

It can be seen in FIG. 3 that the boxes representing coils are touching. As applied to an actual system, the term "adjacent" will be taken to mean close together or nearly touching, since coils are not simple boxes that can be butted together. It can also be seen that there are two gaps in the line of coils where line 167 passes through zero. When the magnitude of the compensation field is small (at such points) there is very little effect on the accumulated error of a beam by omitting the compensation field. In general, it would be possible to reduce costs in a particular application by placing coils only where the magnitude of the counterpart curve to line 167 is large enough to justify compensation. Such a distribution will be referred to as "nonuniform" for purposes of this application. System designers will readily be able to calculate the number and spacing of coils required to reduce errors in a particular application so that the position of the coils generally coincides with peaks in curve 167.

In a magnetic lens, the image is rotated as it passes through the lens, as is illustrated in FIG. 1. This rotation complicates the normal imaging process of the lens. In addition, in a fixed-axis lens, the image of the deflection field will rotate about the fixed axis. This requires calculation of the effect of the rotation and corresponding adjustment to the deflection field applied to produce a desired result.

When a curvilinear axis is applied to the beam deflection, according to the invention, no rotation of the deflection field about the system axis occurs; though the image or beam still rotates about the curvilinear axis. Thus, if an electron beam formed an image at the image plane and the beam was on the axis of the lens, it would be rotated by some amount relative to the object plane. If this beam was then deflected with a curvilinear axis, the image would still be rotated at the image plane, but the entire curvilinear axis would lie in a plane that also contains the z-axis and the deflected central ray of the beam.

The fact that the variable axis of the lens follows the central ray of the beam makes application of the deflection fields and the curvilinear axis yoke fields straight forward, since the curvilinear axis lies in a vertical plane, and the deflection field and the variable axis-shifting field are mutually orthogonal. In the case where the beam travels in the x-z plane, for example, the variable axis correction field will be parallel to the X axis and the deflection will be parallel to the Y axis. The deflection field is applied to one axis of a yoke, and the curvilinear correction is applied to the other (yokes conventionally have coils that apply a field in two orthogonal directions in the x-y plane). In general, the deflection may be in a plane other than those containing the two field axes of the yoke. Thus the fields and therefore the currents to energize each axis of the yoke must be coupled according to the sine and cosine of the azimuthal angle of the deflected beam relative to the yoke axes.

The function $R(z)$ is determined by calculating the electron trajectory for a given deflection yoke arrangement, as is known in the art. It is not even necessary to include the lens field in this calculation since the central ray of the deflected beam is unaffected by the lens in a curvilinear axis lens. The lens axial field and its derivative are usually found by computer simulation of the lens. The curvilinear axis function $Y(z)$ of line 167 can then be derived by multiplying the derivative of the lens field by $R(z)$. This function would then be scaled proportional to the magnitude of the deflection currents in each axis of the deflection yoke, and then the curvilinear axis correction currents would be applied to the orthogonal axes of the deflection yoke or, alternatively, to separate correction yokes.

In the example of FIG. 1, a single set of yokes provides both axis compensation and deflection. The computer for the control means calculates the combined current to be applied to both the X-coils and the Y-coils in each of yokes 150-1 to 150-n and 250-1 to 250-n to produce the required net field.

This arrangement of a plurality of yokes distributed along the z-axis has the further advantage that a smaller current in each of a number of distributed coils will produce the same deflection as a larger current in a single coil or a few coils, so that the current can be reduced and/or the number of turns (and inductance) can be reduced, in order that the speed of the deflection response will be greater. In addition, the use of a number of smaller distributed deflection yokes permits a better approximation to the curve representing the compensation field. In a particular example, a lens designed for a 100 keV electron system had a total length along the z-axis of 600 mm and used 13 axis-shifting coils.

CORRECTION OF ABERRATIONS

Figure 2:
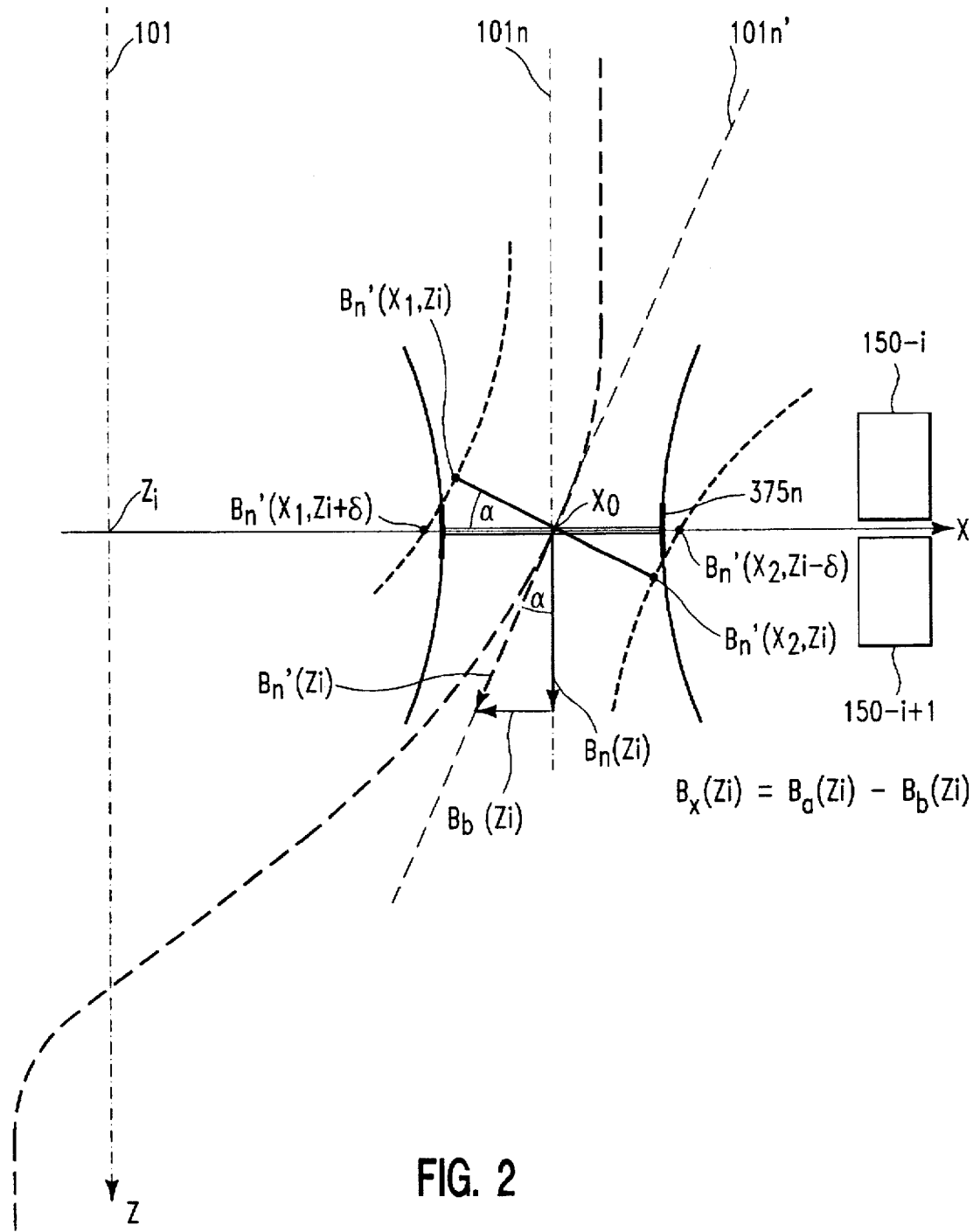
FIG. 2 represents the different spatial orientation of the lens field and a curvilinear trajectory of a particle beam.

In order to provide a readily comprehensible description of the invention without the burden of unnecessary detail, the following description of the effect of the curvilinear axis on the beam and on the image formed on the wafer is simplified, without affecting the essential features. Referring now to FIG. 2, there is shown the relationship between the local magnetic field and the electron beam trajectory before and after the correction supplied by the present invention.

At the left of the Figure, system axis 101 extends along the z-axis. At the right, the right-hand portion of axis-shifting coils $150_i$ and $150_{i+1}$ are shown schematically. The left side of the coils is outside the range of the Figure. At the center of the drawing, short vertical bars $375_n$ represent the boundary of the group of electrons that passed through the nth subfield in reticle 375 (located above the portion of the system illustrated in this figure). A horizontal line between the two vertical bars represents a "slice" of electrons, which represent the subfield in the reticle, as they passed through the reticle simultaneously in a short time period. Local magnetic lens axis $101_n$ is represented by a vertical line, since the magnetic axis has been shifted as explained above to center on the nth subfield. The lens field, $B_n(x,z)$, as shifted by yokes 150-1 to 150-n according to the prior art, is represented by slightly curving solid lines on either side of axis $101_n$. In the prior art of axis-shifting lenses, the current in yokes 150-i and 150-i+1 was equal and axis $101_n$ remained straight and parallel to axis 101. In order to have the local field axis follow the beam, the currents in the yokes 150 are changed. In the example shown, the current in yoke $150_{i+1}$ will be less than that in $150_i$, in order to bring the local axis in closer to axis 101. The combined effect of the two yokes is indicated by a tilted axis $101_n'$ and the curved dashed lines in the Figure, the magnitude of which is shown as a tilted vector $B_n'(x,z)$, where the prime denotes the field after the axis-tilt.

It has been unexpectedly observed that additional aberrations have been introduced by this tilt. The net field (meaning the combination of all fields) on the local axis is now not perpendicular to the x-y plane, as shown, but the electrons representing the subfield continue to travel in a plane parallel to the x-y plane and thus the plane containing these electrons is no longer perpendicular to the local axis of symmetry $101_n'$. As a result, the local field about local axis $101_n$ is no longer azimuthally symmetric, as it was in the prior art.

The x-component of the total axis-shifting and tilting yoke field may be represented to a good approximation by the equation:

$$B_x(z_i) = B_a(z_i) - B_b(z_i) = B_a(z_i) - c(z_i) \cdot \{\partial B_a(x,y,z)/\partial z\}_{z_i},$$

where $B_a$ is the axis-shifting field and $B_b$ is the tilting or bending field (both parallel to the x-axis). While the lens field tilt has no effect on the subfield center at x-location $X_0$ in FIG. 2, the lens fields $B_n(x_1,z_i)$ and $B_n(x_2,z_i)$ do change, in the opposite direction to one another. The electrons on the right of subfield $375_n$ see a field $B_n'(x_2, z_i)$ that may be approximated by $B_n'(x_2, z_i-\delta)$. Similarly, the electrons on the left see a field that may be approximated as $B_n'(x_1,z_i+\delta)$.

It will be apparent to those skilled in the art in the light of the foregoing discussion that this tilt of the local axis with respect to the x-y plane introduces aberrations that were not present in prior art systems. In FIG. 2, there is a finite angle α, greater than a threshold angle, between dotted line $101_n'$, representing the trajectory of the central ray of the beam, and local axis $101_n$. The term "threshold angle" is used to indicate an angle such that the effect of the tilt contributes an aberration to the beam that is above a system-dependent threshold and requires correction. If the field on local axis $101_n'$ contains a non-negligible component perpendicular to the velocity vector of the electrons, the vector equation F= $\vec{v} \times B$ will contain components that were not present in prior art systems having a straight variable axis and the improvement provided by the use of the curvilinear axis carries with it a new contribution to the error budget. Both the focusing action and the deflection will be changed from what it would be if the beam were parallel to the z-axis.

In the light of the foregoing explanation, those skilled in the art will appreciate intuitively that what is desired is a supplementary field that will compensate the tilt of the lens field to be locally perpendicular to the subfield axis $101_n$. This can be accomplished by a set of two focus coils carrying opposing currents that are centered on the system z-axis 101 and overlap along axis 101, but are tilted with respect to the x-y plane. The tilt axis does not necessarily intersect the central ray of the beam but has a tilt field azimuthal angle derived by fitting the parameters of the correction coil set to the observed aberrations. If desired, two crossed coil pairs, one having axes in the x-z plane and the other having axes in the y-z plane, may be used to apply a supplemental tilt field at a desired tilt field azimuthal angle.

The coils each generate a field that is not uniform in the x-y plane. The combination has symmetry about four axes at 90° to each other, illustratively at ±45° and ±135°. As a result this four-fold correction field creates aberrations with the same symmetry, which have to be corrected by hexapoles such as those described in Electron and Ion Optics by Miklos Szilagyi 1988 Plenum Press, N.Y.

Figure 5:
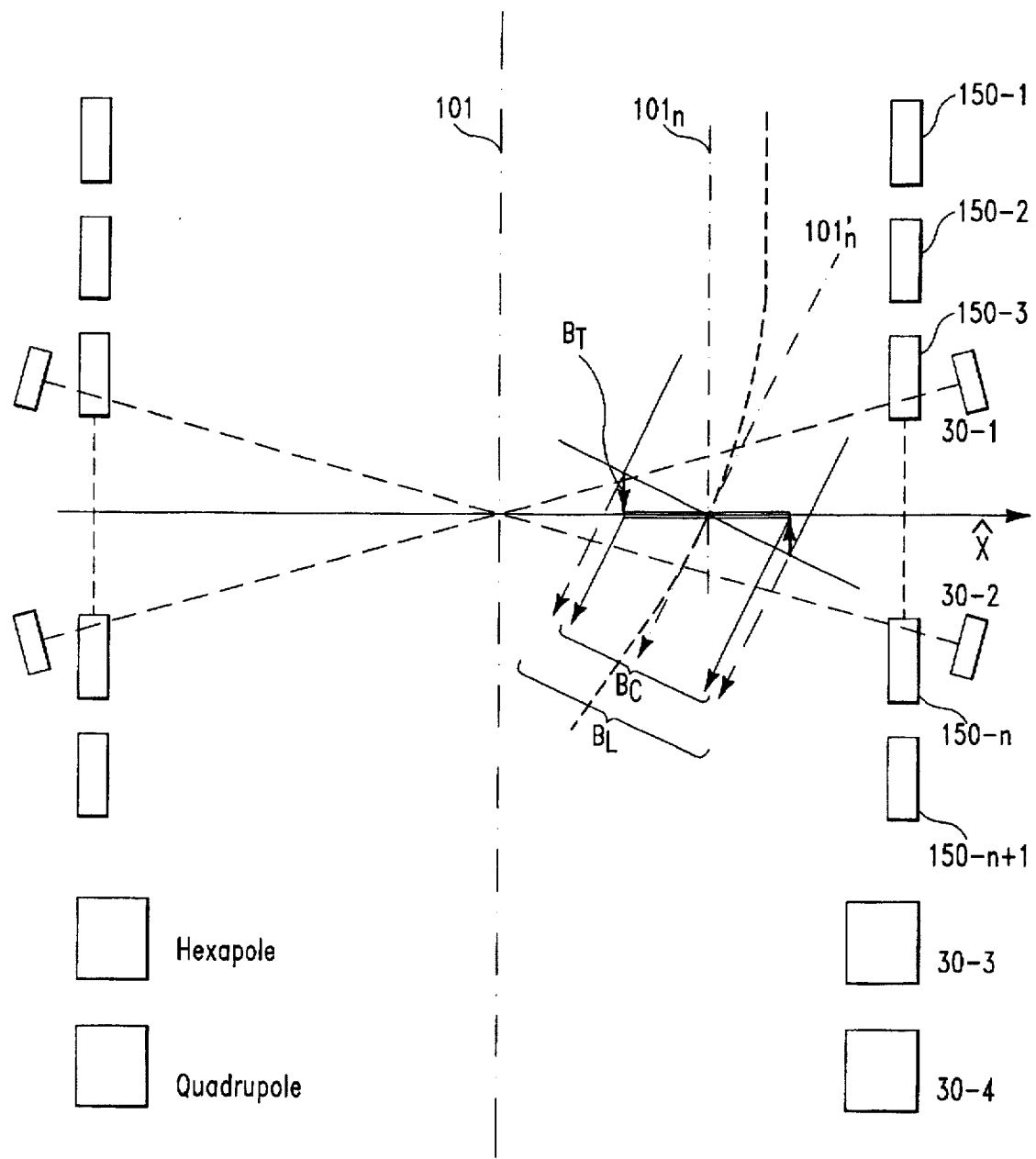
FIG. 5 is a schematic cross section of a lens showing correction elements to compensate for aberrations caused by the curvilinear axis.

Referring to FIG. 5, there is shown in partially schematic, partially pictorial fashion a portion of axis shifting yoke array 150 with additional tilting coils as well as other correcting elements. Elements 30-1 and 30-2 are circular coils, each having its plane tilted at an angle $\beta_1$ and $\beta_2$ with respect to the x-y plane. The angles do not have to be equal. They have, however, to be chosen to generate a gradient of the z-components of their respective fields in the radial direction from the central axis to the local axis $101_n$ that is sufficiently large to provide the necessary tilt correction. An upper limit is given by the requirement that the tilt correction field not overpower the axis-shifting and/or curvilinear-axis-generating deflection fields of the yokes 150. Without loss of generality, the coils are shown as having a coil axis in the x-z plane, since the illustrative system operates in that plane. In the Figure, coils 30-1 and 30-2 are excited to apply a tilt field $B_T$ to the lens field $B_L$ to produce a corrected field $B_C$ that is shown here as parallel to the central ray trajectory $101_n'$ passing through the center of the nth subfield. There will be additional correction coil pairs and, in addition, variable axis hexapoles 30-3 and quadrupoles 30-4 that provide correction for pre-existing aberrations as well as new aberrations potentially generated by the tilt coils.

Lens theory has categorized errors as described by X. Zhu, H. Lin and E. Munro, Optik 61, 121 (1982). In third order theory, there are 27 aberrations, each of which is represented by a complex number. Nineteen aberrations are deflection dependent. Seventeen of these, excluding transverse chromatic aberration, can in principle be completely corrected. In one example, one would use 17 correction elements, namely 11 crossed coil pairs and 6 hexapoles. The 19th aberration, deflection distortion, would be corrected by beam positioning calibration. In practice, different systems will have different error budgets and also different sensitivity to the various aberrations. Some designers will find that they do not require correction of all aberrations and therefore that they need fewer than 11 coil pairs. Others may find that they do not have enough space to fit all coils in optimum locations and have to make do with less than an optimum number.

Correction elements are a function of total system aberrations, not the number of lenses or axis-shifting yokes. It is not necessary that each yoke $150_i$ be accompanied by a set of tilt coils and the number of correction elements required will not double for a two-lens system (or triple for a three lens system).

The correction elements (22, say) may be placed in the system as is convenient. It is not required to correct the beam throughout the system so long as it is corrected when it lands on wafer 59. Indeed, it may be that the correction field will deliberately be made non-parallel to local axis $101_n'$ if that is required to suppress aberrations in other parts of the system, in particular at the wafer. The magnitude of correction currents and the location of elements are highly dependent on system details and will vary widely. In the particular case of the system shown in FIG. 1, it is preferable to use 22 pairs of coils, 2 quadrupoles and 6 hexapoles. The compensation elements can be spaced uniformly throughout the length of the system, or grouped in available locations not required for the lenses or other primary system elements.

Once a system design is laid out and the physical locations of elements are known, a conventional iterative process, well known to those skilled in the art, comprises setting an initial desired trajectory (through the nth subfield, say); calculating the deflections required to produce that trajectory (the focus fields are already known to first order); calculating the aberrations resulting from the curvilinear trajectory and the tilt currents to correct for them; recalculating the trajectory to allow for the tilt currents; etc. until the solution converges with a tolerable error. Conventional algorithms and programs are well known in the art to make such calculations and used routinely to design systems.

Figure 6A:
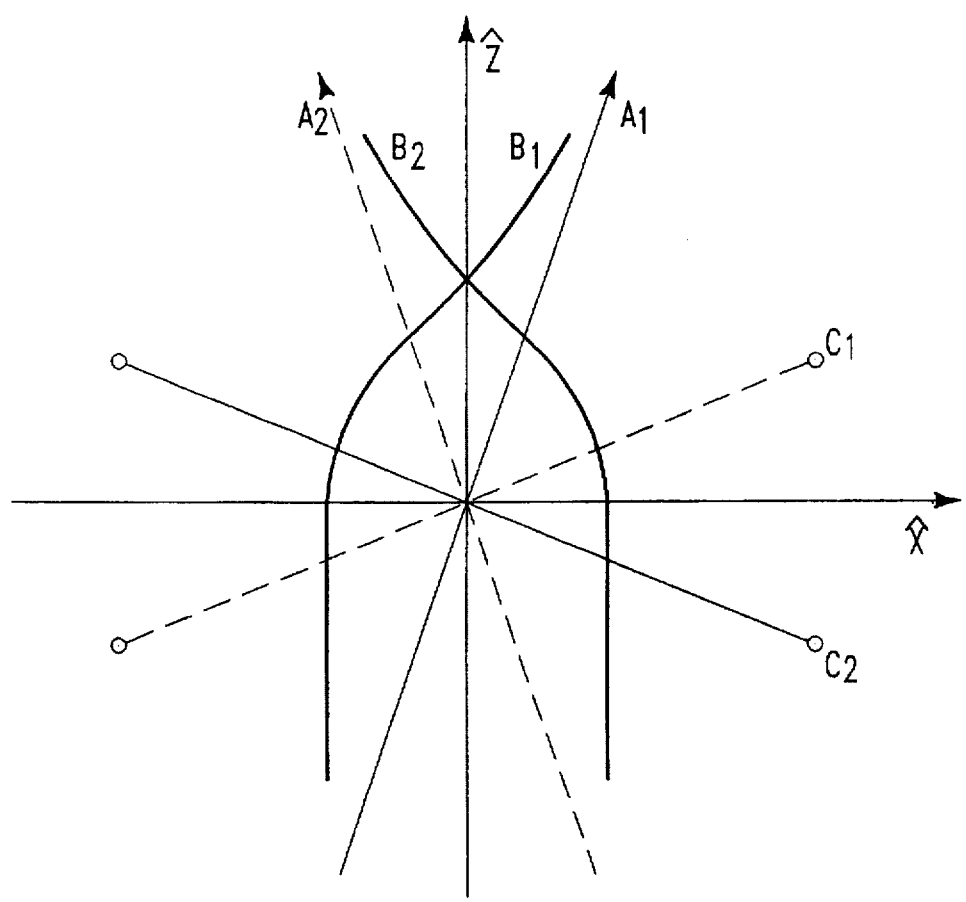
FIG. 6a illustrates in partially pictorial, partially schematic form a tilt correction coil pair according to the invention and their individual axial field distributions.
Figure 6B:
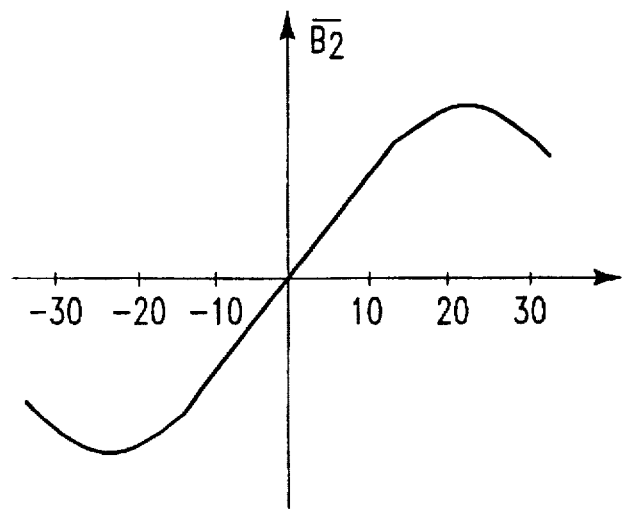

Referring now to FIGS. 6a and 6b, there is shown in FIG. 6a a crossed coil pair C1 and C2, oriented at ±20° with respect to the x-y plane (i.e. the coils make angles of opposite sense with the plane perpendicular to the system axis) and energized with currents also having opposite sense, (i.e. one clockwise and the other counterclockwise), and the fields B1 and B2 from those coils. The axes of coils C1 and C2 are in the same vertical plane. In general, there will be two orthogonal crossed coil pairs having first, second, third and fourth currents in order to put the radial gradient along the desired tilt field azimuthal angle. The correction of 7 of the 18 correctable aberrations, deflection coma radius, deflection coma length, their subfield distortions and three mixed aberrations, require a correction field in the z-direction with a radial gradient ($\partial B_z/\partial r$). FIG. 6b illustrates the gradient in the radial direction of the z-component of the combined field from the two coils as a function of z. The angle of a coil with respect to the x-y plane can be chosen between about 15° and 25°, the lower limit determined by the sensitivity required and the upper limit by the bias field getting too large.

A device generating a radial field with a radial gradient of a gradient would also work, but only devices which generate the complex conjugate of such a gradient of a gradient are known, namely hexapoles, which generate (and can therefore also correct) fourfold aberrations.

It has been found that the gradient is linear for radial distances off axis small compared to the coil diameter, independent of the coil angle. At the system axis 101, the two fields cancel, but at reasonable distances from the axis, they combine to give a linear result. In the example illustrated, the diameter of the coils was 100 mm, giving a linear combination over the range z=±25 mm, r<30 mm.

Those skilled in the art will appreciate that electrostatic means can be used to produce the same result as magnetic means in many circumstances albeit with more difficulty, and the terms deflectors, compensation means and the like are intended to include electrostatic deflection systems as well as magnetic ones.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A curvilinear axis correction system for charged particle optical lenses comprising:

a lens having field generating means disposed about a system axis and extending a lens length along said system axis for producing a focusing field to focus a charged particle beam; and axis-shifting means for producing a set of axis compensation fields within said lens, said set of axis compensation fields being substantially uniform in a plane perpendicular to said system axis and varying in magnitude as a function of position along said system axis, said function of position being dependent on a trajectory of a central ray of said charged particle beam and said set of axis compensation fields having a magnitude sufficient to cancel a radial component of said focusing field, whereby a variable axis of said focusing field is substantially coincident with said trajectory of said central ray of said charged particle beam; characterized in that:

an intersection angle between said trajectory of said central ray of said charged particle beam and said focusing field at an axis-shifting plane exceeds an intersection threshold value and said system further includes at least one tilt means for applying at least one tilt field in addition to said set of axis compensating fields.

2. A system according to claim 1, further characterized in that:

said at least one tilt field has a radial tilt field gradient of a z-component at a tilt field azimuthal angle about said system axis.

3. A system according to claim 2, further characterized in that:

said at least one tilt field means introduces fourfold aberrations in said charged particle beam and said correction system further includes a set of hexapole elements for compensating said fourfold aberrations.

4. A system according to claim 3, further characterized in that:

said at least one tilt field means includes at least one pair of tilt coils overlapping along said system axis, a first one of which having at least one turn and surrounding said system axis at a first tilt coil radius in a first tilt coil plane tilted with respect to said system axis by a first tilt angle and a second one of which also having at least one turn and surrounding said system axis at a second tilt coil radius in a second tilt coil plane tilted with respect to said system axis by a second tilt angle having a sense opposite that of said first tilt angle, said first and second tilt coils having perpendicular axes in a first vertical plane containing said system axis and carrying first and second tilt currents in opposite senses to form said radial gradient.

5. A system according to claim 4, further characterized in that:

said at least one tilt field means includes a first pair of tilt coils overlapping along said system axis and a second pair of tilt coils overlapping said first pair of tilt coils along said system axis, a first one of said second pair having at least one turn and surrounding said system axis at a third tilt coil radius in a third tilt coil plane tilted with respect to said system axis by a third tilt angle and a second one of said second pair also having at least one turn and surrounding said system axis at a fourth tilt coil radius in a fourth tilt coil plane tilted with respect to said system axis by a fourth tilt angle having a sense opposite that of said third tilt angle, said third and fourth tilt coils having perpendicular axes in a second vertical plane containing said system axis and carrying third and fourth tilt currents in opposite senses to form said radial gradient at said tilt field azimuthal angle.

6. A system according to claim 5, further characterized in that said tilt field azimuthal angle is substantially the same as a beam azimuthal angle of said trajectory of said central ray of said charged particle beam.

7. A system according to claim 3, further characterized in that said system comprises at least two tilt field means and six hexapoles.

8. A system according to claim 1, further characterized in that:

said at least one tilt field means introduces fourfold aberrations in said charged particle beam and said correction system further includes a set of hexapole elements for compensating said fourfold aberrations.

9. A system according to claim 8, further characterized in that:

said at least one tilt field means includes at least one pair of tilt coils overlapping along said system axis, a first one of which having at least one turn and surrounding said system axis at a first tilt coil radius in a first tilt coil plane tilted with respect to said system axis by a first tilt angle and a second one of which also having at least one turn and surrounding said system axis at a second tilt coil radius in a second tilt coil plane tilted with respect to said system axis by a second tilt angle having a sense opposite that of said first tilt angle, said first and second tilt coils having perpendicular axes in a first vertical plane containing said system axis and carrying first and second tilt currents in opposite senses to form a radial tilt field gradient of a z-component.

10. A system according to claim 9, further characterized in that:

said at least one tilt field means includes a first pair of tilt coils overlapping along said system axis and a second pair of tilt coils overlapping said first pair of tilt coils along said system axis, a first one of said second pair having at least one turn and surrounding said system axis at a third tilt coil radius in a third tilt coil plane tilted with respect to said system axis by a third tilt angle and a second one of said second pair also having at least one turn and surrounding said system axis at a fourth tilt coil radius in a fourth tilt coil plane tilted with respect to said system axis by a fourth tilt angle having a sense opposite that of said third tilt angle, said third and fourth tilt coils having perpendicular axes in a second vertical plane containing said system axis and carrying third and fourth tilt currents in opposite senses to form said radial gradient at a tilt field azimuthal angle.

11. A system according to claim 10, further characterized in that said tilt field azimuthal angle is substantially the same as a beam azimuthal angle of said trajectory of said central ray of said charged particle beam.

* * * * *